United States Patent
Yabe

(10) Patent No.: US 10,964,390 B1
(45) Date of Patent: Mar. 30, 2021

(54) SKIP CODING FOR FRACTIONAL BIT-PER-CELL NAND MEMORIES

(71) Applicant: Western Digital Technologies, Inc., San Jose, CA (US)

(72) Inventor: Hiroki Yabe, Kanagawa (JP)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/709,338

(22) Filed: Dec. 10, 2019

(51) Int. Cl.
 G11C 11/56 (2006.01)
 G11C 16/04 (2006.01)

(52) U.S. Cl.
 CPC ...... *G11C 16/0483* (2013.01); *G11C 11/5628* (2013.01); *G11C 11/5635* (2013.01); *G11C 11/5642* (2013.01)

(58) Field of Classification Search
 CPC . G11C 16/0483; G11C 16/10; G11C 11/5628; G11C 11/5635; G11C 11/5642
 See application file for complete search history.

(56) References Cited

U.S. PATENT DOCUMENTS

| | | | |
|---|---|---|---|
| 2009/0109746 A1* | 4/2009 | Aritome | G11C 16/0483 365/185.03 |
| 2010/0002504 A1 | 1/2010 | Kim et al. | |
| 2014/0119089 A1 | 5/2014 | Meir et al. | |
| 2014/0244964 A1* | 8/2014 | Khayat | G11C 11/5642 711/202 |
| 2015/0228344 A1* | 8/2015 | Park | G06F 12/0238 711/103 |
| 2015/0332759 A1 | 11/2015 | Huang et al. | |
| 2015/0378815 A1 | 12/2015 | Goda et al. | |
| 2018/0076828 A1 | 3/2018 | Kanno | |
| 2019/0363099 A1* | 11/2019 | Lee | H01L 27/11582 |

OTHER PUBLICATIONS

International Search Report and Written Opinion, PCT/US2020/024620, dated Dec. 3, 2020.

* cited by examiner

*Primary Examiner* — Jay W. Radke
(74) *Attorney, Agent, or Firm* — Dickinson Wright PLLC; Steven Hurles

(57) ABSTRACT

An apparatus and method of skip coding user data is provided. According to skip coding, for each cell in which an upper page is 0, data is stored in a half page. For each portion of data in which the upper page is 1, data is not stored in the half page. Thus, cells of a NAND memory may each store 3.5 bits, in one of twelve available states.

15 Claims, 8 Drawing Sheets

|  | TLC | 3.5 bits per cell | QLC |
|---|---|---|---|
| Number of states | 8 | 12 | 16 |
| Programming performance | ~60 MB/s | ~30 MB/s | ~15 MB/s |
| Read time | ~70 ns | Between ~70 - 40 ns | ~140 ns |
| Endurance | 3k | 2-3k | 1k |
| Cost | Reference | ~16.7% cheaper than MLC | ~33.3% cheaper than MLC |

SKIP CODING FOR FRACTIONAL BIT-PER-CELL NAND MEMORIES

BACKGROUND

Technical Field

Apparatuses and methods consistent with example embodiments relate to fractional coding of user data and, more particularly, relate to X3.5 cell fractional coding of NAND memories.

Description of the Related Art

Three-dimensional (3D) Not-AND (NAND) flash memory is a type of non-volatile flash memory in which memory cells are stacked vertically in multiple layers. 3D NAND was developed to address challenges encountered in scaling two-dimensional (2D) NAND technology to achieve higher densities at a lower cost per bit.

A memory cell is an electronic device or component capable of storing electronic information. Non-volatile memory may utilize floating-gate transistors, charge trap transistors, or other transistors as memory cells. The ability to adjust the threshold voltage of a floating-gate transistor or charge trap transistor allows the transistor to act as a non-volatile storage element (i.e. a memory cell), such as a single-level cell (SLC) which stores a single bit of data. In some cases more than one data bit per memory cell can be provided (e.g., in a multi-level cell) by programming and reading multiple threshold voltages or threshold voltage ranges. Such cells include, but are not limited to a multi-level cell (MLC), storing two bits per cell; a triple-level cell (TLC), storing three bits per cell; and a quad-level cell (QLC), storing four bits per cell.

FIG. 1 illustrates a diagram of an example 3D NAND memory array. In this example, the memory array is a 3D NAND memory array. However, this is just one example of a memory array. The memory array includes multiple physical layers that are monolithically formed above a substrate, such as a silicon substrate.

Storage elements, for example memory cells 1001, are arranged in arrays in the physical layers. A memory cell 1001 includes a charge trap structure between a word line 1050 and a conductive channel 1042. Charge can be injected into or drained from the charge trap structure via biasing of the conductive channel 1042 relative to the word line 1050. For example, the charge trap structure can include silicon nitride and can be separated from the word line 1050 and the conductive channel 1042 by a gate dielectric, such as a silicon oxide. An amount of charge in the charge trap structure affects an amount of current through the conductive channel 1042 during a read operation of the memory cell 1001 and indicates one or more bit values that are stored in the memory cell 1001.

The 3D memory array includes multiple blocks. Each block includes a "vertical slice" of the physical layers that includes a stack of word lines 1050. Multiple conductive channels 1042 (having a substantially vertical orientation, as shown in FIG. 1) extend through the stack of word lines 1050. Each conductive channel 1042 is coupled to a storage element in each word line 1050, forming a NAND string of storage elements, extending along the conductive channel 1042. FIG. 1 illustrates three blocks, five word lines 1050 in each block, and three conductive channels 1042 in each block for clarity of illustration. However, the 3D memory array can have more than three blocks, more than five word lines per block, and more than three conductive channels per block.

Physical block circuitry is coupled to the conductive channels 1042 via multiple conductive lines: bit lines, illustrated as a first bit line BL0, a second bit line BL1, and a third bit line BL2 at a first end of the conductive channels (e.g., an end most remote from the substrate) and source lines, illustrated as a first source line SL0, a second source line SL1, and a third source line SL2, at a second end of the conductive channels (e.g., an end nearer to or within the substrate). The physical block circuitry is illustrated as coupled to the bit lines BL0-BL2 via "P" control lines, coupled to the source lines SL0-SL2 via "M" control lines, and coupled to the word lines 1050 via "N" control lines. Each of P, M, and N can have a positive integer value based on the specific configuration of the 3D memory array.

Each of the conductive channels 1042 is coupled, at a first end to a bit line BL, and at a second end to a source line SL. Accordingly, a group of conductive channels 1042 can be coupled in series to a particular bit line BL and to different source lines SL.

It is noted that although each conductive channel 1042 is illustrated as a single conductive channel, each of the conductive channels 1042 can include multiple conductive channels that are in a stack configuration. The multiple conductive channels in a stacked configuration can be coupled by one or more connectors. Furthermore, additional layers and/or transistors (not illustrated) may be included as would be understood by one of skill in the art.

Among other things, the physical block circuitry facilitates and/or effectuates read and write operations performed on the 3D memory array. For example, data can be stored to storage elements coupled to a word line 1050 and the circuitry can read bit values from the memory cells 1001.

As noted above, a memory cell may store any of various numbers of bits per cell. An SLC stores one bit per cell; an MLC stores two bits per cell; a TLC stores three bits per cell; and a QLC stores four bits per cell. When it is desirable to store a fractional number of bits per cell in a memory device, a bit puncturing method may be used.

SUMMARY

Example embodiments may address at least the above problems and/or disadvantages and other disadvantages not described above. Also, example embodiments are not required to overcome the disadvantages described above, and may not overcome any of the problems described above.

According to an aspect of an example embodiment, a method of encoding user data comprises encoding user data into an upper page and a half page. The half page is then skip coded such that, for each cell in which a bit in the upper page is 0, data is stored in the half page, and for each cell bit in which a bit in the upper page is 1, no data is stored in the half page.

User data may also be encoded into a middle page and a lower page.

After encoding the user data into the upper page, and prior to skip coding data in the half page, it may be determined if a number of is in the upper page is greater than a number of 0s in the upper page. Then, if the number of 1s is greater than the number of 0s, the data in the upper page is flipped such that the is are changed to 0s and the 0s are changed to 1s.

The data of the upper page, the middle page, the lower page, and the half page may be transmitted to a NAND memory device, and the data may be stored in plurality of cells of the NAND memory device by biasing each the plurality of cells to one of twelve available states.

Error correction code may be added to the upper page and to the half page, such that a volume of error correction code added to the upper page is twice a volume of error correction code added to the half page.

According to an aspect of another example embodiment, a method of reading data from a memory device is provided. The method comprises reading and error correction decoding an upper page of data, and reading a half page of data. The half page is then skip decoded such that, for each cell in which a nit in the upper page is 0, data is read from the half page, and for each cell in which a bit in the upper page is 1, the half page is disregarded.

The half page may also be error correction decoded.

A middle page and a lower page of data may also be read and error correction decoded.

According to an aspect of another example embodiment, a non-transitory computer-readable medium storing thereon software instructions is provided. When the software is executed by a processor, it causes the processor to encode user data into an upper page and a half page, and to skip code data in the half page such that, for each cell in which a bit in the upper page is 0, data is stored in the half page, and for each cell in which a bit in the upper page is 1, no data is stored in the half page.

BRIEF DESCRIPTION OF THE DRAWINGS

The above and/or other aspects will become apparent and more readily appreciated from the following description of example embodiments, taken in conjunction with the accompanying drawings in which.

DETAILED DESCRIPTION

Figure 1:
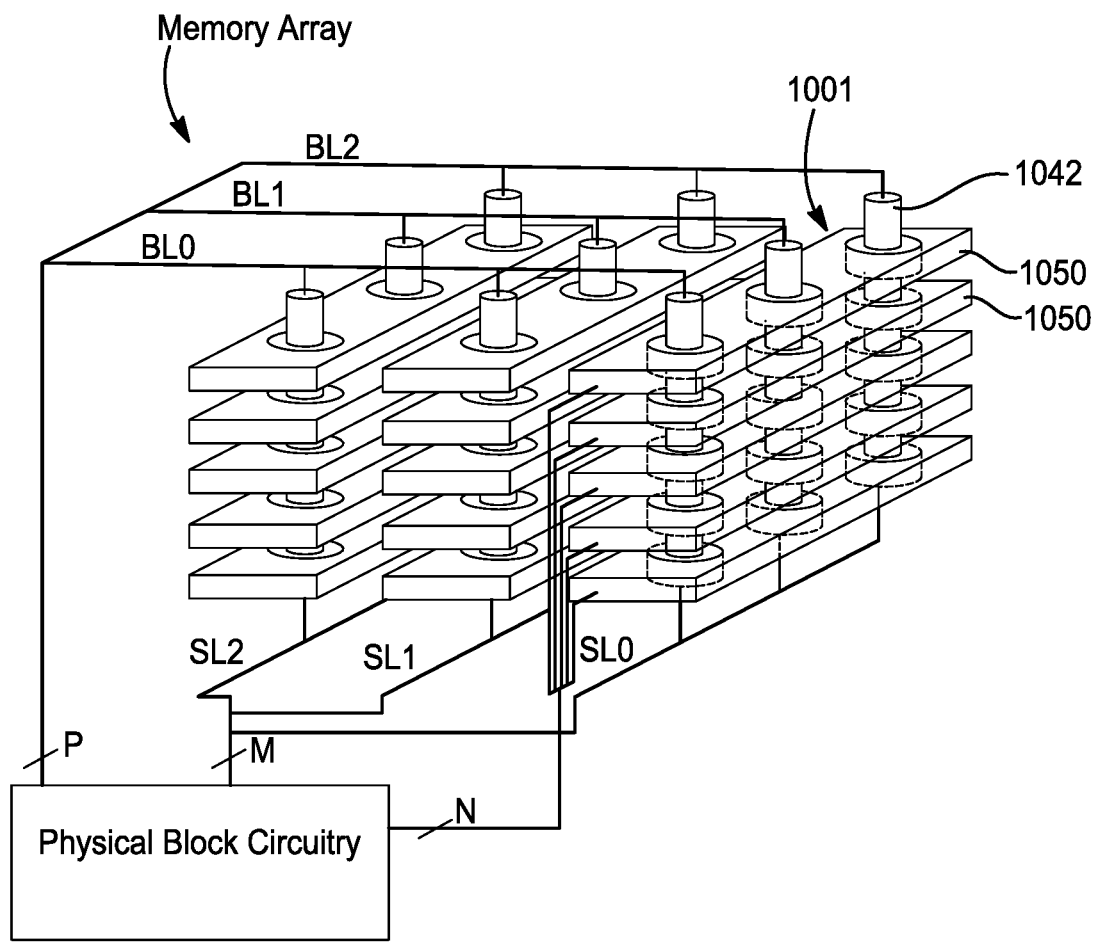
FIG. 1 is a diagram of an example 3D NAND memory array.

Reference will now be made in detail to example embodiments which are illustrated in the accompanying drawings, wherein like reference numerals refer to like elements throughout. In this regard, the example embodiments may have different forms and may not be construed as being limited to the descriptions set forth herein.

It will be understood that the terms "include," "including", "comprise, and/or "comprising," when used in this specification, specify the presence of stated features, integers, steps, operations, elements, and/or components, but do not preclude the presence or addition of one or more other features, integers, steps, operations, elements, components, and/or groups thereof.

It will be further understood that, although the terms "first," "second," "third," etc., may be used herein to describe various elements, components, regions, layers and/or sections, these elements, components, regions, layers and/or sections may not be limited by these terms. These terms are only used to distinguish one element, component, region, layer or section from another element, component, region, layer or section.

As used herein, the term "and/or" includes any and all combinations of one or more of the associated listed items. Expressions such as "at least one of," when preceding a list of elements, modify the entire list of elements and do not modify the individual elements of the list. In addition, the terms such as "unit," "-er (-or)," and "module" described in the specification refer to an element for performing at least one function or operation, and may be implemented in hardware, software, or the combination of hardware and software.

Various terms are used to refer to particular system components. Different companies may refer to a component by different names this document does not intend to distinguish between components that differ in name but not function.

Matters of these example embodiments that are obvious to those of ordinary skill in the technical field to which these example embodiments pertain may not be described here in detail.

Figures 2, 3:
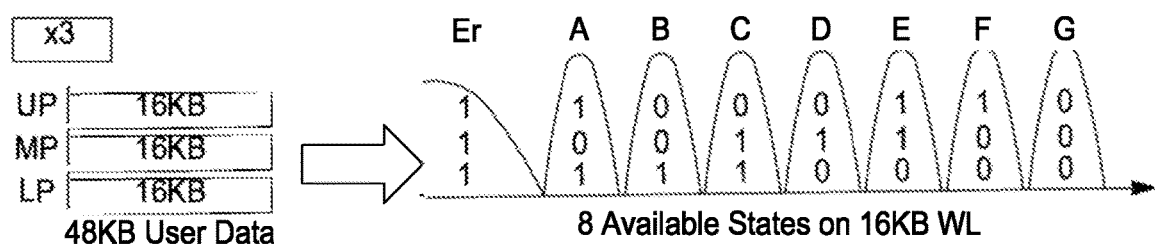
FIG. 2 illustrates comparative advantages of storing 3.5 bits per cell, as compared to 3 or 4 bits per cell.
FIG. 3 is a related art mapping of 48 KB of user data onto TLCs with a total of eight possible states.

As discussed above, among typical memory cells, there are TLC, which store three bits per cell, and QLC, which store four bits per cell. FIG. 2 illustrates the comparative advantages of storing 3.5 bits per cell, as compared to TLC and QLC. With three bits stored per cell, and each bit storing one of two states, each TLC cell be programmed in any one of 8 different states, each represented by one of 8 different voltages levels to which the cell can be programmed. In comparison, each QLC cell can be programmed in any one of 16 different states, each represented by one of 16 different voltage levels to which the cell can be programmed. A cell storing 3.5 bits, an X3.5 cell, can be programmed in any one of 12 different states, each represented by one of 12 different voltage levels to which the cell can be programmed. It is also apparent that while programming and reading is slower for a memory device storing more bits per cell, the cost of the device decreases. A memory device storing 3.5 bits per cell may fill in the performance and cost gap between devices with TLCs and devices with QLCs.

FIG. 3 illustrates a related art mapping of 48 KB of user data onto TLCs with a total of eight possible states (Er, A, B, C, D, E, F, and G)—i.e. eight possible voltage levels to which a TLC can be programmed. As shown in FIG. 3, each voltage to which a TLC can be programmed represents three bits of data, each bit being a 1 or 0. In other words, each TLC stores a portion of data comprising three bits—an upper page bit, a middle page bit, and a lower page bit. User data for storage in the TLCS is received, and it is encoded to an upper page (UP), a middle page (MP), and a lower page (LP). Thus, for example, if the first portion of user data to be coded is 0/1/1 (i.e. a 0 of the upper page, a 1 of the middle page, and a 1 of the lower page), the first bit line should program state C, programming a first cell to the voltage level corresponding to program state C; if the second portion od user data is 0/0/1, the second bit line should program state B, programming a second cell to the voltage level corresponding to program state C.

Figure 4A:
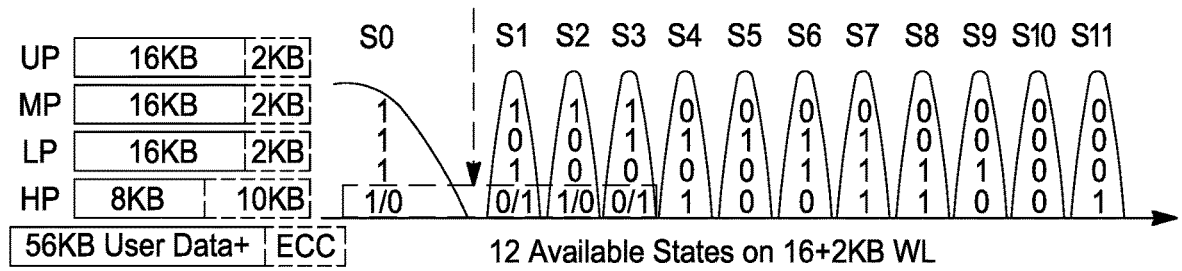
FIGS. 4A and 4B are a related art mappings of user data using bit puncturing to store fractional data.
Figure 4B:
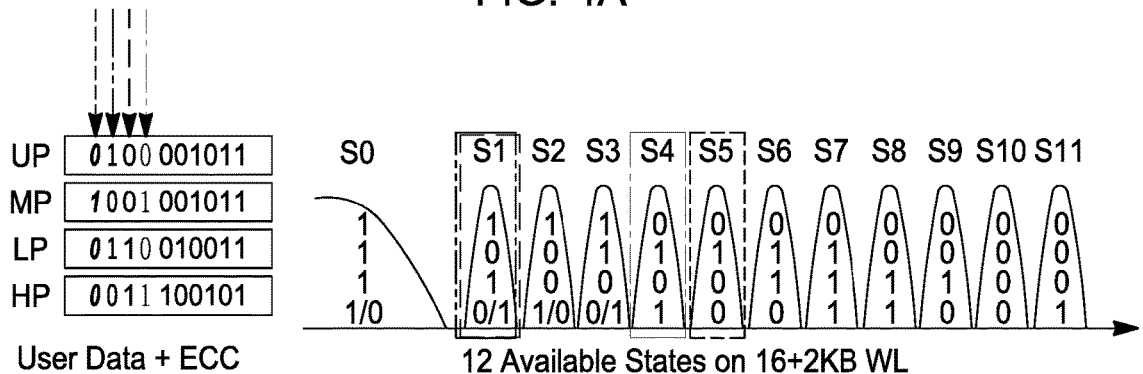

FIGS. 4A and 4B illustrate a related art mapping of user data using bit puncturing to store fractional data (i.e. effectively storing a fractional number of bits per cell). As noted, storing fractional data, for example, storing 3.5 bits of data per cell in one of 12 available states (i.e. 1 of 12 possible voltage levels, may provide cost benefits. Unlike storing 3 bits per cell or 4 bits per cell, however, the procedure for storing 3.5 bits per cell is not straightforward.

According to bit puncturing, 56 KB of user data is mapped onto cells on a 16 KB word line (WL) with a total of 12 possible states. In this case, in each of the UP, MP, and LP, 16 KB of data and 2 KB of error check code (ECC) are stored. There is also an additional half page (HP) in which 8 KB of data and 10 KB of ECC is stored. Here, the user data is encoded into the UP, MP, LP, and HP.

As shown in FIG. 4A, the 12 possible states (S0, S1, S2, S3, S4, S5, S6, S7, S8, S9, S10, and S11) include four states (S0, S1, S2, and S3) in which the HP data is ignored/skipped. In this case, if the UP data is 1, the HP is ignored/skipped.

As shown on the left in FIG. 4B, user data is fully encoded into the UP, MP, LP, and HP. However, because the HP data is ignored if the UP data is 1, data is lost. In this case, each cells stores a portion of data corresponding to four bits of data. However, while there are 16 different possibilities of four bits of data, each cell can be programmed to only one of 12 different voltage levels. For example, if the first portion of user data is 0/1/0/0, the first bit line should program S5, programming a first cell to the voltage level corresponding to S5. If the second portion of user data is 1/0/1/0, the second bit line should program S1, programming a second cell to the voltage level corresponding to S1. However, if the third portion of data is 1/0/1/1, the third bit line also programs S1, also programming a third cell to the voltage level corresponding to S1. In this case, the HP bit of the second portion of user data and the third portion of user are lost. Overall, with respect to bit puncturing, HP data is lost with a probability of 50 percent. While the HP data is protected by a strong ECC, the erased bits may be recovered. However, the 50 percent erasure rate causes a number of problems. First, as the erased HP data has a 50-50 chance of being 0 or 1, which conventionally didn't exist, modification is needed on the ECC algorithm on the controller. Additionally, there is an asymmetric error rate on the HP, as compared to the UP, MP, and LP, and this means that the HP will show different retention and disturb characteristics than the other pages, making tuning difficult.

Figure 5:
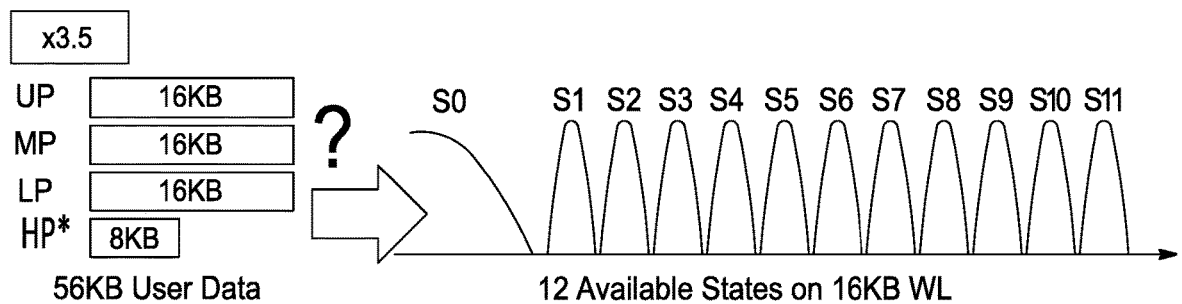
FIG. 5 illustrates a possibility of mapping 56 KB of user data onto a 16 KB WL including "X3.5" cells, storing 3.5 bits per cell and 12 available states, according to an example embodiment.

FIG. 5 illustrates the possibility of mapping 56 KB of user data onto a 16 KB WL including "X3.5" cells, each X3.5 cell storing a portion of data corresponding to one of 12 available states (i.e. one of 12 possible voltage levels). As shown, 16 KB of user data is stored in each of the UP, the MP, and the LP. Eight KB user data is stored in the HP.

Figure 6A:
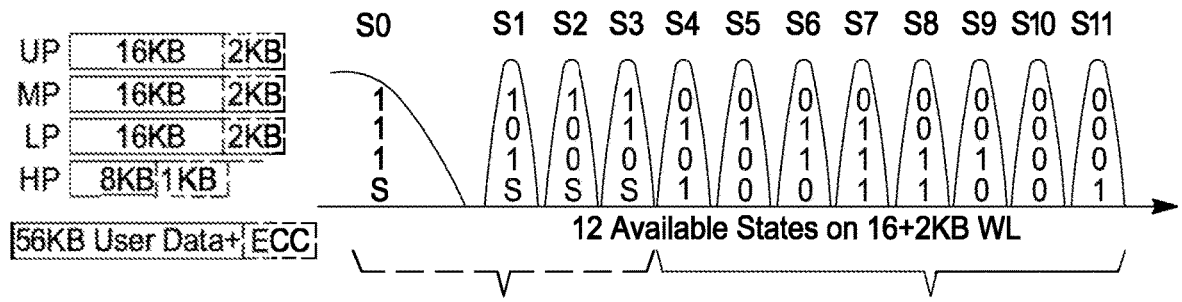
FIG. 6A illustrates a skip coding method of mapping of user data to store fractional data according to an example embodiment.

FIG. 6A illustrates a skip coding method of mapping of user data to store fractional data according to an example embodiment.

As shown, in contrast to a bit puncturing method, according to this example embodiment, 16 KB of user data and 2 KB of ECC are stored in each of the UP, the MP, and the LP. However, unlike with bit puncturing, according to this example embodiment, the HP stores 8 KB of user data and only 1 KB of ECC. This means that, unlike with bit puncturing, the ECC is symmetric with respect to all of the UP, MP, LP, and HP.

Each of the X3.5 cells can be programmed in one of 12 possible states i.e. to one of 12 possible voltage levels. The basis of the coding method is that, depending on the coding of the upper page, data is stored or not stored in the HP i.e. the HP is "skipped" or not skipped. For example, as shown in FIG. 6A, if, in a portion of data, the UP data/bit is 1 the HP is "skipped" and no data is stored in the HP. If, in a portion of data, the UP data/bit is 0, the HP bit is available to store data. Thus, there are four states, S0 (1/1/1/S), S1 (1/0/1/S), S2 (1/0/0/S), and S3 (1/1/0/S) in which the UP data/bit is 1, and the cell does not store HP data (represented here by an "S" for "skip"). In other words, there are four voltage levels to which an X3.5 cell can be programmed which each represent a portion of data comprising only three bits: a UP bit, an MP bit, and an LP bit. There are eight states S4 (0/1/0/1), S5 (0/1/0/0), S6 (0/1/1/0), S7 (0/1/1/1), S8 (0/0/1/1), S9 (0/0/1/0), S10 (0/0/0/0), and S11 (0/0/0/1) in which the UP data/bit is 0 and the cell stores HP data. In other words, there are eight voltage levels to which an X3.5 cell can be programmed which each represent a portion of data comprising four bits, an HP but, an MP bit, an LP bit, and an HP bit. Accordingly, since only three bits of data are stored when the UP is 1 (i.e. the HP bit is skipped), unlike with bit puncturing, there is no erased data.

Figure 6B:
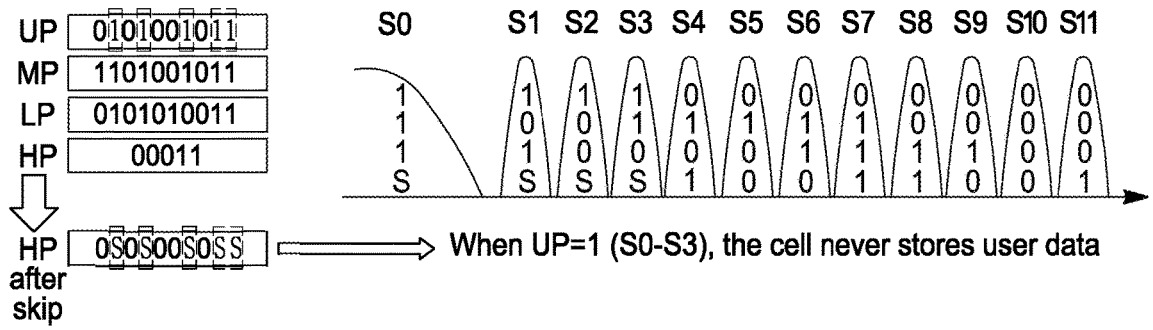
FIG. 6B is a mapping of data when user data is stored using skip coding, according to an example embodiment.

FIG. 6B illustrates a mapping of data when user data is stored using skip coding of 10 X3.5 cells, according to an example embodiment. The user data included in the UP (0101001011), the MP (1101001011), the LP (0101010011), and the HP (00011) is shown to the left. In this example, the portion of data to be stored in the first cell are 0/1/1/0. When skip coding is applied, the HP data becomes (0S0S01S1SS). This is because, as noted above, when the UP of a portion of data to be stored is 0, the portion includes a bit of user data in the HP, and when the UP of a portion of data to be stored is 1, the portion includes only three bits of data: an HP bit, an MP bit, and an LP bit, and the HP is skipped.

In the example of FIG. 6B, the first portion of user data is 0/1/0/0, and the first bit line should program a first cell at S5, programming the first cell to the voltage level corresponding to S5; the second portion of user data is 1/1/1/S, and the second bit line should program a second cell at S0, programming the second cell to the voltage level corresponding to S0; the third portion of user data is 0/0/0/0, and the third bit line should program a third cell at S10, programming the third cell to the voltage level corresponding to S10; and so on. In this way, no HP data is lost, and a simple algorithm is used.

Figure 6C:
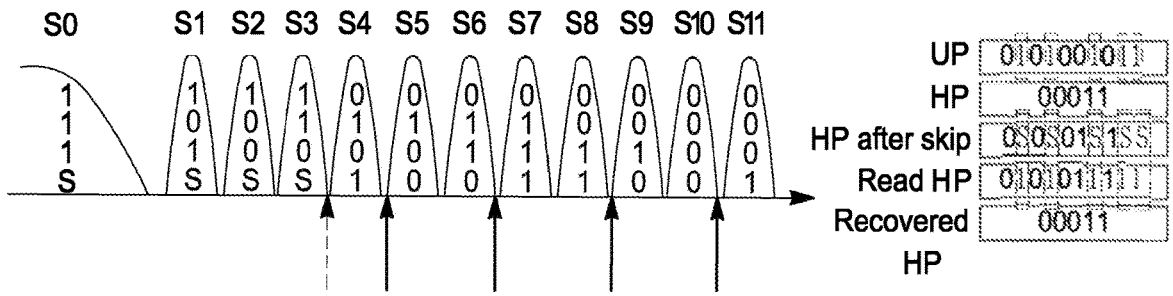
FIG. 6C illustrates a reading of data using skip coding, according to an example embodiment.

The read operation is fairly simple as well. FIG. 6C illustrates a reading of data using skip coding, according to an example embodiment. The UP is read first, and then errors in the UP are corrected using the ECC, and it is re-encoded accordingly. Then, based on the UP data, the HP is read at the appropriate states in which the UP is 0. In the example of FIG. 6C, the HP is read at S5, S7, S9, and S10. Then, where the UP data/bit is 1, the HP data is not stored, and therefore is not read—i.e. is skipped.

Figure 7A:
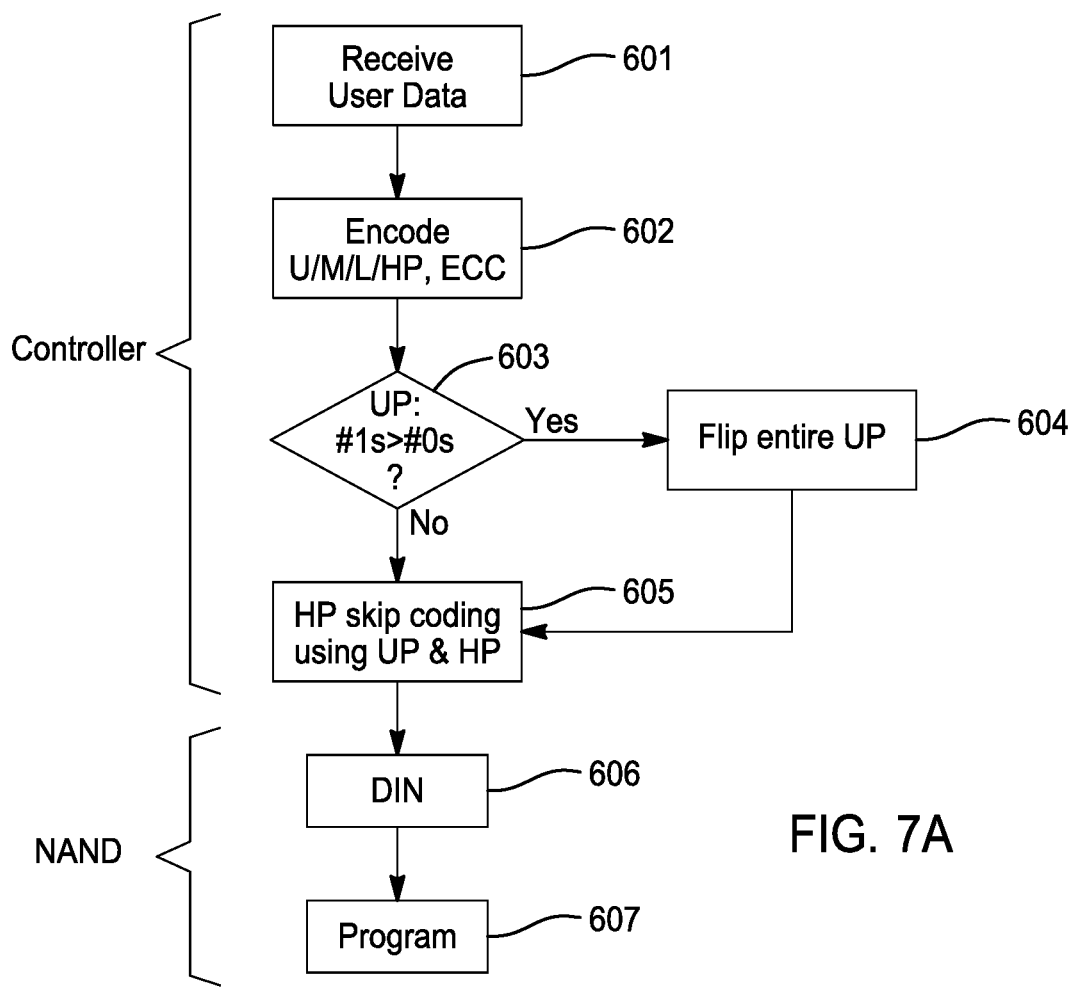
FIG. 7A is a flowchart of a skip coding programming method according to an example embodiment.
Figure 7B:
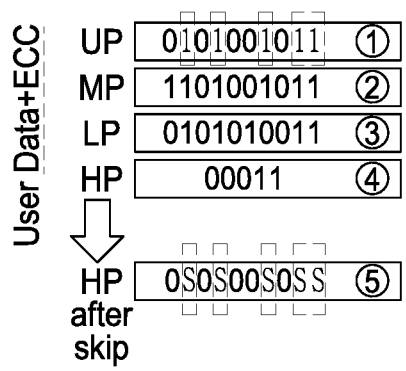
FIG. 7B is an example of a result of an encoding operation according to FIG. 7A.

FIG. 7A is a flowchart of a skip coding programming method according to an example embodiment. When user data is received (601), it is encoded into the UP, MP, LP, HP, and ECC (602). FIG. 7B, at ①, ②, ③, and ④ is an example of a result of the encoding of operation 601, using just 10 portions of data as an example. As discussed above, if, for a portion of data, the UP bit is 1, there is HP stored—i.e. it is skipped. Therefore, if more than half of the upper data/bits is 1s, this means that there will not be sufficient data portions for storing the bits of data in the HP. In this case, the UP may be "flipped," such that the is are stored as 0s and the 0s are stored as 1s, in order to enable sufficient storage for the HP. Thus, a determination is made as to whether the number of 1s is greater than the number of 0s in the UP data/bits (603). If the answer is no (603: NO), then the UP coding will provide sufficient storage for the HP data, a and the method proceeds to performing skip coding using the UP and HP (605). On the other hand, if the answer is yes (603: YES), the entire UP is flipped (604) before proceeding to skip coding using the UP and HP (605). FIG. 7B at ⑤ is an example of a result of applying skip coding to the HP based on the UP. This method of 602-605 is actually a loop that is performed a number of times. The UP, MP, and LP each consist of a data, and the HP consists of half the data as each of the UP, MP, and LP. For example, each of the UP, the MP, and the LP may consist of 16 bits of data, and the HP may consist of 8 bits of data. Data from the UP and data from the HP is processed through the algorithm of 602-605, and this algorithm is then performed a number of times until all of the data is processed.

The data is then transmitted from the controller to the NAND and is input (DIN (606)) and programmed (607).

Figure 7C:
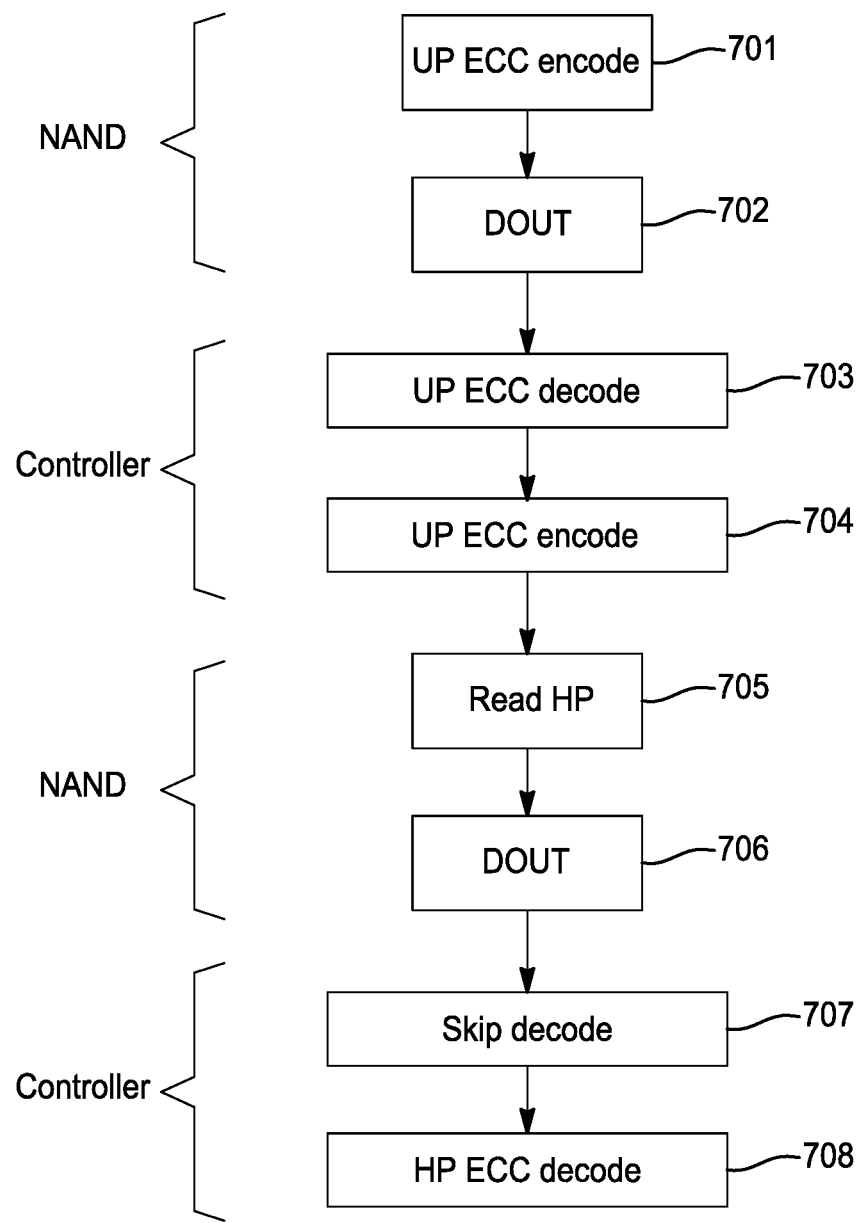
FIG. 7C is a flowchart of a method of reading skip coded data according to an example embodiment.

FIG. 7C is a flowchart of a method of reading skip coded data according to an example embodiment. The UP is read in the NAND (701) and the data is output to the controller (702). The UP data is then ECC decoded (703) because the UP data needs to be correct in order to correctly read the HP. The UP is then ECC encoded (704). FIG. 7B at ① is an example of a result of the UP decoding and encoding. With the correct UP data, the NAND can then read the HP (705) and transmit the read data back to the controller (706), where the HP is skip-decoded (707) and error corrected (708).

As with the programming operations, the reading is also performed in chunks. In order to read one chunk of the HP, it is necessary to decode and error correct two chunks of the HP.

It should be noted that the techniques and methods described above, while described with respect to X3.5 cells, may also be applied to other Xn.5 cells, such as cells storing 2.5 bits per cell with 6 states, or cells storing 4.5 bits per cell with 24 states, for example.

Figure 8:
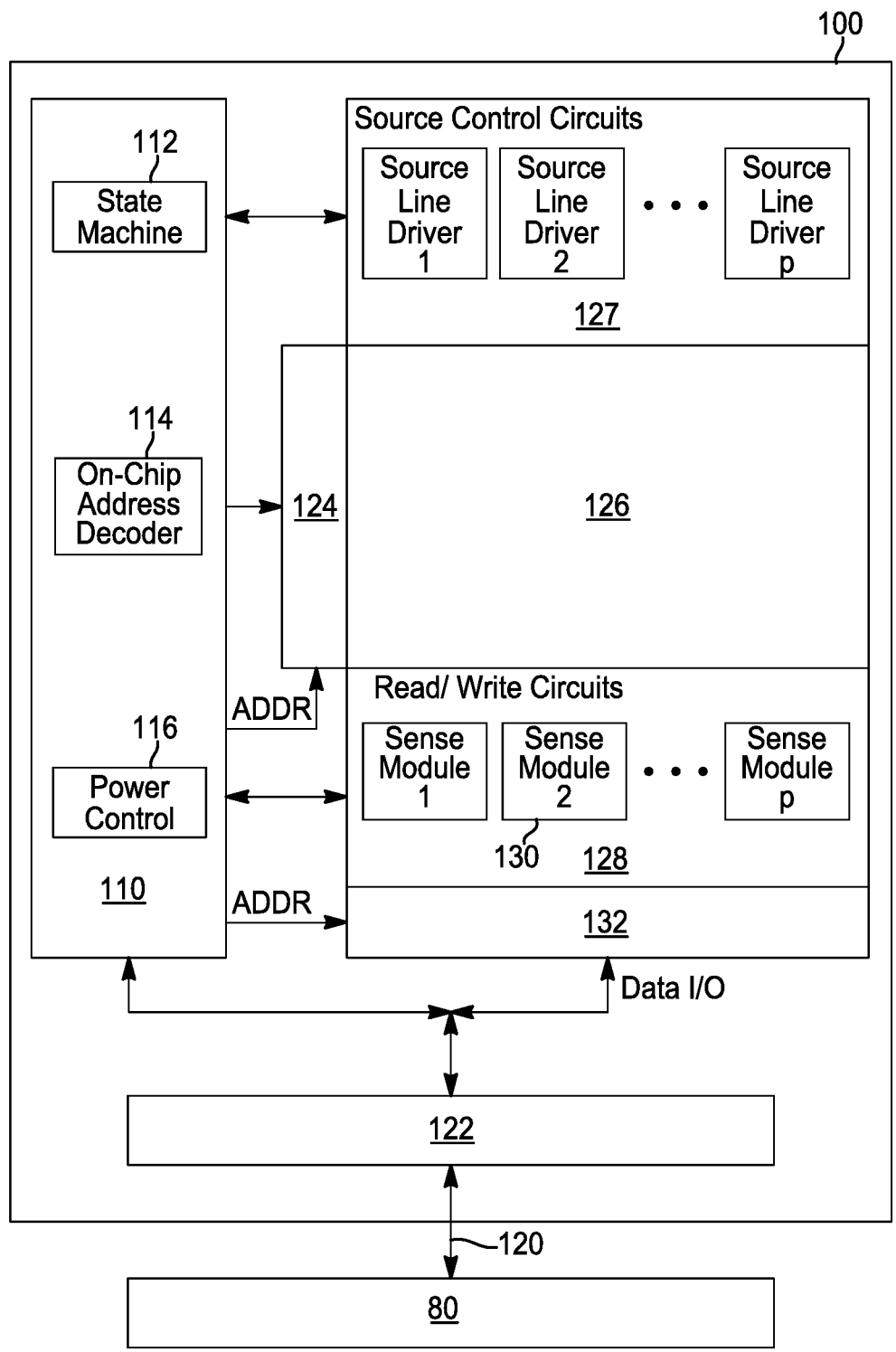
FIG. 8 is a schematic diagram illustrating a memory device according to an example embodiment.

FIG. 8 is a schematic diagram illustrating an example of a memory device 100. The memory device 100 includes a memory array 126 of memory cells, such as a two-dimensional array of memory cells or a three-dimensional array of memory cells. The memory array 126 may include memory cells according to a NAND flash type architecture or a NOR flash type architecture. Memory cells in a NAND configuration are accessed as a group and are typically connected in series. A NAND memory array is composed of multiple strings in which each string is composed of multiple memory cells sharing a bit line and accessed as a group. Memory cells in a NOR configuration may be accessed individually. NAND flash and NOR flash memory cells may be configured for long-term storage of information as non-volatile memory retaining information after power on/off cycles. The memory array 126 may also be other types of memory cells programmable to store multiple bits of data per cell as non-volatile memory or volatile memory and may be other types of memory cells in other configurations besides NAND or NOR configurations. The memory device 100 may include multiple dies of memory arrays 126.

The memory array 126 is addressable by word lines via a row decoder 124 and by bit lines via a column decoder 132. The row decoder 124 selects one or more word lines and the column decoder 132 selects one or more bit lines in order to apply appropriate voltages to the respective gates/drains of the addressed memory transistor.

The read/write circuits 128 are provided to read or write (program) the memory states of addressed memory transistors. The read/write circuits 128 include multiple sense modules 130 (sensing circuitry) that allow a page (or other unit) of memory cells to be read or sensed in parallel. Each sense module 130 includes bit line drivers and circuits for sensing.

Control circuitry 110 cooperates with the read/write circuits 128 to perform memory operations on the memory array 126. Control circuitry 110 may include a state machine 112, an on-chip address decoder 114, and a power control module 116. The state machine 112 provides chip-level control of memory operations. The on-chip address decoder 114 provides an address interface between a host or a memory controller and the hardware address used by decoders 124 and 132. The power control module 116 controls the power and voltages supplied to the word lines and bit lines during memory operations. Control circuitry 110 may include drivers for word lines, source side select lines (SGS), drain side select lines (SGD), and source lines. Control circuitry 110 is also in communication with source control circuits 127, which include source line driver circuits used to drive various voltages on the individual source lines.

The operations described above as being performed by the NAND may be performed by one or more of the control circuitry 110, the row decoder 124, source control circuits 127, and read/write circuits 128, and the column decoder 132.

The memory device 100 includes a controller 122 which operates with a host 80 through a link 120. Commands and data are transferred between the host and the controller 122 via the link 120. The link 120 may include a connection (e.g., a communication path), such as a bus or a wireless connection. The operations described above as being performed by the controller may be performed by the controller 122 or a controller external to the memory device 100, as would be understood by one of skill in the art.

The memory device 100 may be used as storage memory, a main memory, a cache memory, a backup memory, or a redundant memory. The memory device 100 may be an internal storage drive, such as a notebook hard drive or a desktop hard drive. The memory device 100 may be a removable mass storage device, such as, but not limited to, a handheld, removable memory device, such as a memory card (e.g., a secure digital (SD) card, a micro secure digital (micro-SD) card, or a multimedia card (MMC)) or a universal serial bus (USB) device. The memory device 100 may take the form of an embedded mass storage device, such as an eSD/eMMC embedded flash drive, embedded in host 80. The memory device 100 may also be any other type of internal storage device, removable storage device, embedded storage device, external storage device, or network storage device, as would be understood by one of skill in the art.

The memory device 100 may be directly coupled to the host 80 or may be indirectly coupled to the host 80 via a network. For example, the network may include a data center storage system network, an enterprise storage system network, a storage area network, a cloud storage network, a local area network (LAN), a wide area network (WAN), the Internet, and/or another network.

Instructions may be executed by any of various components of memory device 100, such as by the controller 100, controller circuitry 110, the row decoder 124, the column decoder 132, read/write circuits 128, source control circuits 127, logic gates, switches, latches, application specific integrated circuits (ASICs), programmable logic controllers, embedded microcontrollers, and other components of memory device 100.

It may be understood that the example embodiments described herein may be considered in a descriptive sense only and not for purposes of limitation. Descriptions of features or aspects within each example embodiment may be considered as available for other similar features or aspects in other example embodiments.

While example embodiments have been described with reference to the figures, it will be understood by those of ordinary skill in the art that various changes in form and details may be made therein without departing from the spirit and scope as defined by the following claims.

What is claimed is:

1. A method of encoding user data, the method comprising encoding user data into an upper page and a half page of a plurality of portions of data; and
   skip coding data in the half page such that, for each portion of data in which a bit in the upper page is 0, a bit of data is stored in the half page, and for each portion of data in which a bit in the upper page is 1, no data is stored in the half page.

2. The method of claim 1, further comprising encoding user data into a middle page and a lower page.

3. The method of claim 1, further comprising:
   after encoding the user data into the upper page, and prior to the skip coding data in the half page;
   determining if a number of is in the upper page is greater than a number of 0s in the upper page; and
   if the number of is in the upper page is greater than the number of 0s in the upper page, flipping the data in the upper page such that the 1s are changed to 0s and the 0s are changed to 1s.

4. The method of claim 2, further comprising transmitting data of the upper page, the middle page, the lower page, and the half page to a NAND memory device.

5. The method of claim 4, further comprising:
   storing the data of the upper page, the middle page, the lower page, and the half page in a plurality of cells of the NAND memory device by programming each of the plurality of cells to one of twelve available states.

6. The method of claim 1, further comprising:
   adding error correction code to the upper page and adding error correction code to the half page, wherein a volume of the error correction code added to the upper page is twice a volume of the error correction code added to the half page.

7. A method of reading data from a memory device, the method comprising:
   reading an upper page of data;
   error correction decoding the upper page of data;
   reading a half page of data; and
   skip decoding the half page of data, the skip decoding comprising, for each portion of data in which a bit in the upper page is 0, reading corresponding data from the half page, and for each portion of data in which a bit in the upper page is 1, disregarding the half page.

8. The method according to claim 7, further comprising error correction decoding the half page of data.

9. The method according to claim 7, further comprising:
   reading a middle page of data and a lower page of data; and
   error correction decoding the middle page of data and the lower page of data.

10. A memory device comprising:
    a plurality of memory cells; and
    a controller in communication with the memory cells, wherein the controller is configured to:
    encode user data into an upper page and a half page, and
    skip code data in the half page such that, for each portion of data in which a bit in the upper page is 0, a bit of data is stored in the half page, and for each portion of data in which a bit in the upper page is 1, no data is stored in the half page.

11. The memory device of claim 10, wherein the controller is further configured to encode user data into a middle page and a lower page.

12. The memory device of claim 10, wherein the controller is further configured to:
    after encoding the user data into the upper page, and prior to the skip coding data in the half page:
    determine if a number of is in the upper page is greater than a number of 0s in the upper page; and
    if the number of is in the upper page is greater than the number of 0s in the upper page, flip the data in the upper page such that the 1s are changed to 0s and the 0s are changed to 1s.

13. The memory device of claim 11, further comprising transmitting data of the upper page, the middle page, the lower page, and the half page to a NAND memory device.

14. The memory device of claim 10, wherein the controller is further configured to:
    store data of the upper page, the middle page, the lower page, and the half page in a plurality of NAND memory cells by biasing each of the plurality of cells to one of twelve available states.

15. The memory device of claim 10, wherein the controller is further configured to:
    add error correction code to the upper page and add error correction code to the half page, wherein a volume of error correction code added to the upper page is twice a volume of error correction code added to the half page.

* * * * *